(12) United States Patent
Joshi et al.

(10) Patent No.: US 12,135,152 B2
(45) Date of Patent: Nov. 5, 2024

(54) EVAPORATOR ASSEMBLIES, VAPOR CHAMBERS, AND METHODS FOR FABRICATING VAPOR CHAMBERS

(71) Applicant: Toyota Motor Engineering & Manufacturing North America, Inc., Plano, TX (US)

(72) Inventors: Shailesh N. Joshi, Ann Arbor, MI (US); Danny Lohan, Northville, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 66 days.

(21) Appl. No.: 17/518,321

(22) Filed: Nov. 3, 2021

(65) Prior Publication Data
US 2023/0138653 A1    May 4, 2023

(51) Int. Cl.
*F25B 39/02* (2006.01)
*B23P 15/26* (2006.01)

(52) U.S. Cl.
CPC ............ *F25B 39/024* (2013.01); *B23P 15/26* (2013.01)

(58) Field of Classification Search
CPC ............................... F25B 39/024; B23P 15/26
USPC ........................................................ 62/505
See application file for complete search history.

(56) References Cited

U.S. PATENT DOCUMENTS

| 2015/0009631 | A1 | 1/2015 | Joshi |
| 2018/0259268 | A1 | 9/2018 | Zhou et al. |
| 2019/0014688 | A1 | 1/2019 | Weibel et al. |
| 2019/0082560 | A1 | 3/2019 | Dede et al. |
| 2019/0239395 | A1 | 8/2019 | Joshi et al. |
| 2020/0281095 | A1 | 9/2020 | Rush et al. |

FOREIGN PATENT DOCUMENTS

WO    WO2017100568 A2 *  6/2017

OTHER PUBLICATIONS

Srivathsan Sudhakar et al., Design of an Area-Scalable Two-Layer Evaporator Wick for High-Heat-Flux Vapor Chambers URL: https://www.researchgate.net/publication/326849430_Design_of_an_Area-Scalable_Two-Layer_Evaporator_Wick_for_High-Heat-Flux_Vapor_Chambers, Jul. 2018.

* cited by examiner

*Primary Examiner* — Davis D Hwu
(74) *Attorney, Agent, or Firm* — DINSMORE & SHOHL LLP

(57) ABSTRACT

Evaporator assemblies, vapor chamber assemblies, and methods for fabricating a vapor chamber are disclosed. In one embodiment, an evaporator assembly for a vapor chamber includes an evaporator surface, an array of posts extending from the evaporator surface, and an array of vapor vents within the evaporator surface. Each vapor vent of the array of vapor vents is configured as a depression within the evaporator surface. The evaporator assembly further includes a porous layer disposed on the evaporator surface, the array of posts, and the array of vapor vents.

18 Claims, 6 Drawing Sheets

EVAPORATOR ASSEMBLIES, VAPOR CHAMBERS, AND METHODS FOR FABRICATING VAPOR CHAMBERS

TECHNICAL FIELD

The present specification generally relates to vapor chambers and, more particularly, to vapor chambers having low thermal resistance and high heat dissipation.

BACKGROUND

Heat generating devices, such as motors, power electronic devices, and microprocessors, generate significant heat that should be removed to ensure that the heat generating devices operate below their maximum operating temperature. As power demands increase and the size of heat generating components decreases, it becomes challenging to remove heat flux from the heat generating devices.

Accordingly, a need exists for alternative cooling devices for removing heat flux from heat generating devices.

SUMMARY

In one embodiment, an evaporator assembly for a vapor chamber includes an evaporator surface, an array of posts extending from the evaporator surface, and an array of vapor vents within the evaporator surface. Each vapor vent of the array of vapor vents is configured as a depression within the evaporator surface. The evaporator assembly further includes a porous layer disposed on the evaporator surface, the array of posts, and the array of vapor vents.

In another embodiment, an assembly includes an evaporator assembly and a condenser plate. The evaporator assembly includes an evaporator surface, an array of posts extending from the evaporator surface, and an array of vapor vents within the evaporator surface. Each vapor vent of the array of vapor vents is configured as a depression within the evaporator surface. The evaporator assembly further includes a porous layer disposed on the evaporator surface, the array of posts, and the array of vapor vents. The condenser plate includes a condenser surface, wherein the condenser surface is bonded to a top surface of the array of posts such that the evaporator assembly and the condenser plate define a vapor chamber.

In yet another embodiment, a method of fabricating a vapor chamber includes forming an array of posts and an array of vents in an evaporator surface, applying a metal powder including metal particles to the evaporator surface, the array of posts, and the array of vents, sintering the metal powder to form a porous layer, and bonding a condenser surface of a condenser plate to a top surface of the array of posts.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1A:
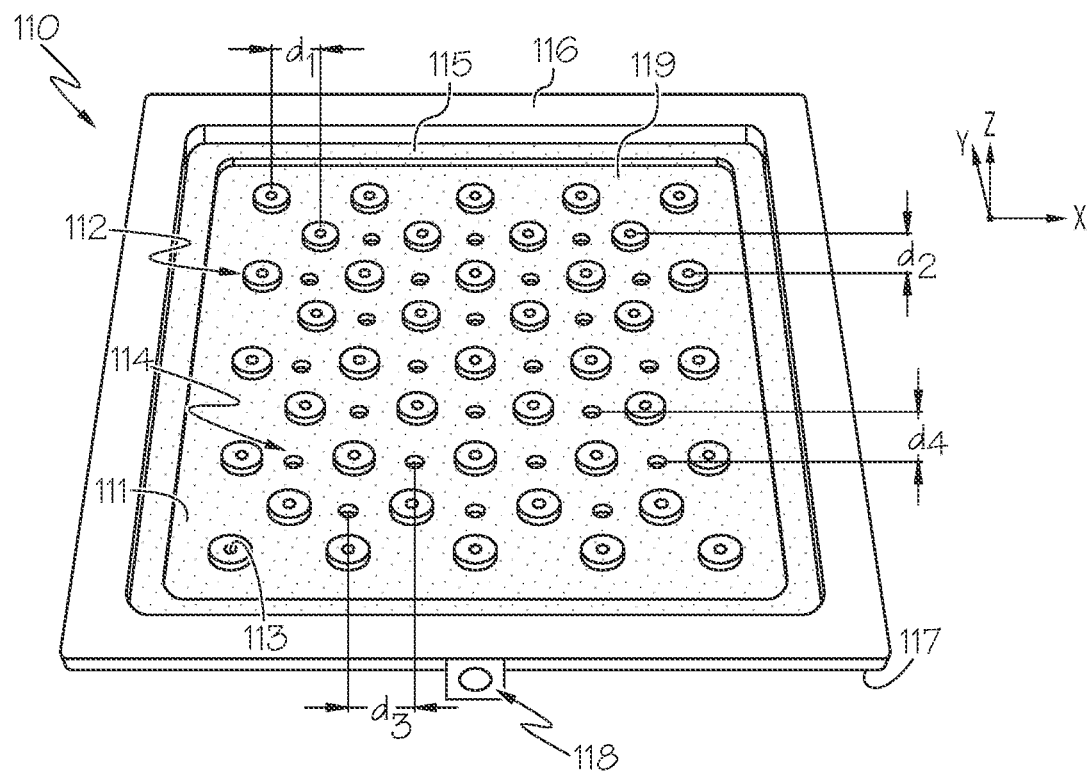
FIG. 1A schematically depicts a top perspective view of an example evaporator assembly having an evaporator surface with an array of posts and array of vents according to one or more embodiments described and illustrated herein.

Referring generally to the appended figures, embodiments of the present disclosure are directed to cooling devices configured as a vapor chamber for removing heat flux from a heat generating device, such as an electronic device. Electronic devices, such as microprocessors and power electronic switching devices ("power electronic devices"), generate significant heat that should be removed to maintain the electronic devices below their maximum operating temperature. Electronic devices that operate above their maximum operating temperature are at risk of failure. Cooling devices may be used to remove heat flux to keep the electronic device (or other heat generating device, such as a motor) below its maximum operating temperature.

In electrified vehicles, wide band gap (WBG) devices such as silicon carbide may replace traditional silicon-based power semiconductors due to their low power loss and high efficiency characteristics. In addition, WBG devices dissipate higher heat fluxes (e.g., greater than 1 kW/cm$^2$) and operate at high temperature exceeding 473 K. The high temperature operation of WBG devices provide larger thermal budget to design a lower cost and compact cooling systems such as air cooling. To achieve a compact and high-performance air-cooling system, the heat spreading from the heat source to the heat sink plays a key role.

A vapor chamber is a cooling device that removes heat flux h a phase change of a cooling fluid from a liquid to a gas. Typically vapor chambers are a closed system whereby liquid cooling fluid is present on an evaporator surface that receives heat flux from the heat generating device. This liquid cooling fluid raising in temperature until its boiling point is reached when it evaporates into gas and moves toward a condenser surface. The condenser surface is cooler than the evaporator surface such that it lowers the temperature of the gas so that it condenses into a liquid that moves back toward the evaporator surface. In some cases, a wicking structure may be provided to move the liquid cooling fluid toward the evaporator surface by capillary action. Traditionally, vapor chamber heat spreaders are used to efficiently spread the heat; however, their performance is limited up to a heat flux of less than about 500 W/cm² over a 1 cm×1 cm area.

A significant problem with vapor chambers is the phenomenon of dry out. Dry out occurs when the power of the heat generating device raises the temperature to such a degree that liquid cooling fluid cannot return to the evaporator surface quickly enough to cool the heat generating device. In effect, the evaporator surface "dries out" because no liquid cooling fluid is present. The causes the temperature of the heat generating device to raise above its maximum operating temperature.

Embodiments of the present disclosure provide a more efficient vapor chambers that significantly raise the dry out temperature of the vapor chamber and thus significantly raise the maximum operating power of the heat generating device. In embodiments an array of porous posts connect an evaporator surface with a condenser surface to provide a wicking path for returning condensed, liquid cooling fluid to the evaporator surface from the condenser surface. Further, an array of vapor vents are disposed within the evaporator surface that provide additional nucleation sites and therefore more efficient evaporation of the cooling fluid. The combination of the array of posts and the array of vapor vents enables heat generating devices to operate at elevated temperatures with minimized risk of dry out, such as, without limitation, operating power greater than 600 W. Additionally, the vapor chambers described herein provide low thermal resistance. Particularly, tested vapor chambers of the embodiments described herein dissipate the highest heat flux of 589 W/cm² and provide the lowest total thermal resistance of 0.28 K/W among all vapor chamber designs that were evaluated.

Various embodiments of evaporator assemblies, power electronic assemblies, and methods for fabricating a vapor chamber are described in detail below.

Referring now to FIG. 1A, an example evaporator assembly 110 that may be used in conjunction with a condenser plate for forming a vapor chamber is schematically illustrated. The evaporator assembly 110 is configured as an evaporator plate having an evaporator surface 111 and a heat receiving surface 117. The evaporator assembly 110 is fabricated from a thermally conductive material, such as, without limitation, copper. The heat receiving surface 117 receives a heat receiving device (not shown), such as a power electronic device. The power electronic device may be a power switching device, such as a power metal-oxide-semiconductor field-effect transistor (MOSFET), power transistor, power insulated-gate bi-polar transistor (IGBT), and the like. The power electronic device may be a WBG device comprising, without limitation, silicon carbide. It should be understood that embodiments are not limited by any electronic device or heat generating device.

The example evaporator assembly 110 includes a perimeter surface 116 that surrounds the evaporator surface 116. As described in more detail below, the perimeter surface 116 may be coupled to a perimeter surface of a condenser plate to form a vapor chamber. The evaporator assembly 110 further include an input port 118 for providing cooling fluid to the vapor chamber. The input port 118 may include a valve to close the vapor chamber during operation, thereby providing a closed system.

The evaporator surface 111 is offset from the perimeter surface 116 in a negative system vertical direction (i.e., negative z-axis direction) so that a vapor chamber may be formed when the evaporator assembly 110 is coupled to a condenser plate. In the example embodiment, the evaporator assembly 110 further includes a porous perimeter ledge 115 that is configured to receive a porous condenser surface of a condenser plate. It should be understood that in other embodiments, no perimeter ledge is provided. Rather, an entire perimeter wall is porous without a ledge present.

The example evaporator assembly 110 comprises an array of posts 112 that extend from the evaporator surface 111. As described in more detail below, the array of posts 112 provide a wicking path for condensed cooling fluid to return to the evaporator surface 111. The array of posts 112 are defined by a plurality of rows and a plurality of columns. The individual posts 112 of adjacent rows are offset from one another in the x-axis direction by an offset distance $d_1$. The individual posts 112 of adjacent columns are offset from one another in the y-axis direction by an offset distance $d_2$. The values for distances $d_1$ and $d_2$ are not limited by this disclosure and may depend on the overall dimensions of the cooling device.

The posts 112 are illustrated as being cylindrical in shape. However, embodiments are not limited thereto. For example, the posts 112 may be configured as rectangular pillars, or any other shape in cross section. Embodiments are further not limited by the size of the posts. In the cylindrical embodiment, as non-limiting examples, the diameter of the posts 112 may be 0.5 mm to 3 mm, 1 mm to 1.5 mm, or 1 mm. It should be understood that the diameter may be other values depending on the overall size of the cooling device. Further, the height of the array of posts 112 is not limited by this disclosure. Non-limiting heights include 0.5 mm to 5 mm, 1 mm to 4 min, 1.5 mm to 3 mm, or 2.5 mm. It should be understood that other heights may be utilized.

The evaporator surface 111 further includes an array of vapor vents 114 that are depressions within the evaporator surface 111 in the negative z-axis direction. As described in more detail below, the array of vapor vents 114 increase the efficiency of the vapor chamber and enable dissipation of high heat flux without dry out. Dimensions and shape of the vapor vents 114 are not limited by this disclosure. In the illustrated embodiment, the individual vapor vents 114 are circular in shape. However, embodiments are not limited to vapor vents 114 having a circular shape as other shapes are possible, such as rectangular, elliptical, triangular, or arbitrarily shaped. As non-limiting examples, the diameter of the individual vapor vents 114 may be 0.25 mm to 2 mm, 0.5 mm to 1.5 mm, or 1 mm. Other diameters may be utilized depending on the overall size of the cooling device. Non-limiting depths of the individual vapor vents 114 include 0.1 mm to 1 mm, 0.25 mm to 0.75 mm, or 0.5 mm. It should be understood that other depths may be used.

The individual vapor vents 114 of adjacent rows are offset from one another in the x-axis direction by an offset distance $d_3$. The individual vapor vents 114 of adjacent columns are offset from one another in the y-axis direction by an offset distance $d_4$. The values for distances $d_3$ and $d_4$ are not limited by this disclosure and may depend on the overall dimensions of the cooling device. The array of posts 112 and the array of vapor vents 114 are interlaced between each other. Accordingly, the array of posts 112 and the array of vapor vents 114 define a structure array, wherein each row of the structure array comprises alternating individual posts and individual vapor vents and each column of the structure array comprises alternating individual posts and individual vapor vents. Each individual vapor vent 114 is surrounded by four individual posts 112.

The evaporator assembly 110 further includes a porous layer 119 disposed on the evaporator surface 111, the array of posts 112, and the array of vapor vents 114. The porous layer 119 has a plurality of pores that act as a wicking structure to bring liquid cooling fluid back to the evaporator surface 111. The thickness of the porous layer 119 defines the dimensions of the array of posts 112 and the array of vapor vents 114 described above.

Figure 1B:
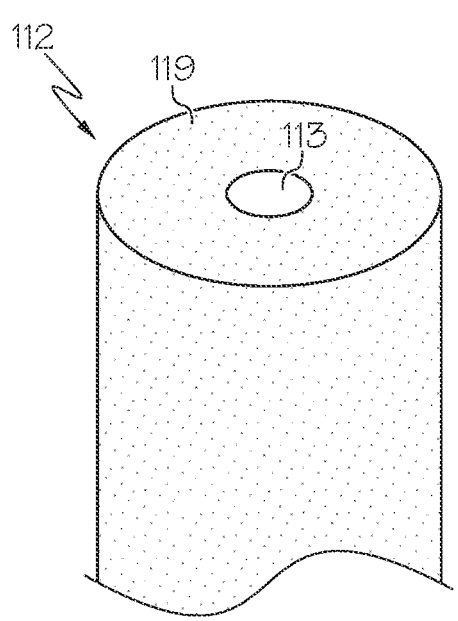
FIG. 1B schematically depicts a top perspective view of an example post of the evaporator assembly of FIG. 1A.

Referring now to FIG. 1B, a close-up view of a post is depicted. Individual posts 112 of the array of posts 112 may be configured a pin 113 (e.g., a pin fin) that is coated with a porous layer 119. Thus, the posts 112 are defined by a core that is a solid pin 113 and an outer, porous layer. The pins may be formed by any known or yet-to-be-developed process such as, without limitation, machining or chemical etching. For example, the array of posts 112 comprise an array of smaller dimeter pin fins and the porous layer 119 surrounding the array of pin 113 sets the overall diameter of the array of posts 112. As a non-limiting example, each pin 113 may have a diameter of 0.5 mm, and the thickness of the porous layer 119 may be 0.5 mm to set a diameter of 1 mm for each post 112. The thickness of the porous layer 119 is not limited by this disclosure. As non-limiting example, the thickness of the porous layer 119 may be 0.2 mm to 1 mm, 0.25 mm to 1 mm, or 0.5 mm. It should be understood that other thicknesses may be utilized.

In some embodiments, the porous layer 119 may be fabricated by applying a powder comprising metal particles, such as copper particles. The size of the metal particles dictates the size of the pores within the porous layer 119. As a non-limiting example, the metal particles may have a diameter of 60 to 120 μm. After application of the powder of metal particles, the metal particles are sintered to form the porous layer 119 by raising the temperature of the evaporator assembly 110 above the sintering temperature of the metal particles (e.g., within a range of 750° C. and 1000° C. for copper particles).

Figure 2:
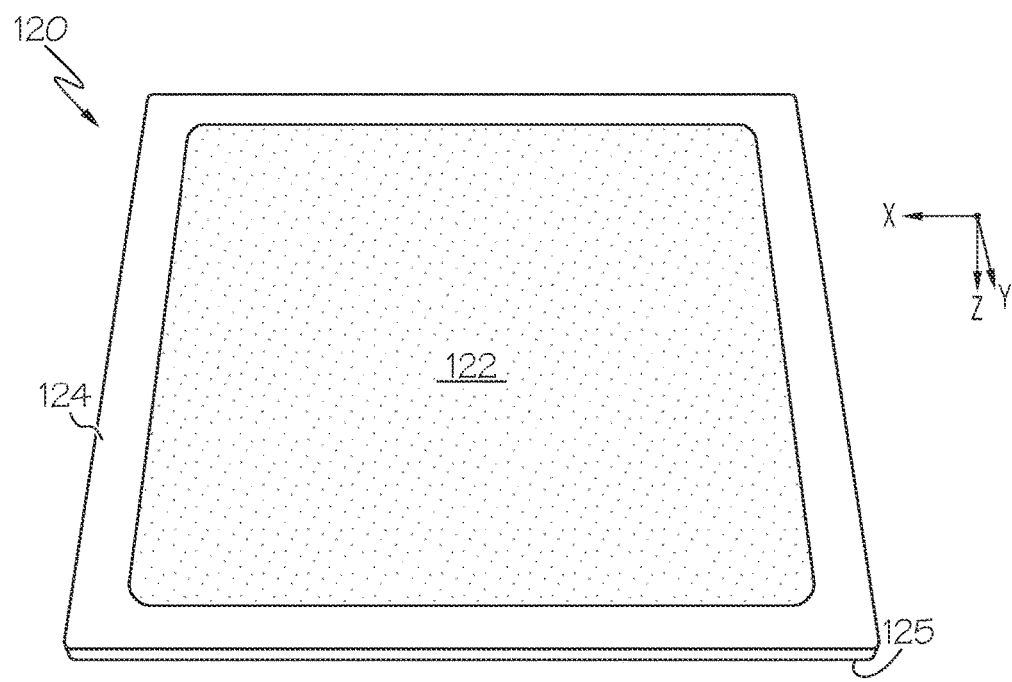
FIG. 2 schematically depicts a bottom perspective view of an example condenser plate having a condenser surface according to one or more embodiments described and illustrated herein.

FIG. 2 illustrates a condenser plate 120 having a condenser surface 122 and a cooling surface 125. The condenser surface 122 may be surrounded by a condenser perimeter surface 124 that is configured to be coupled or otherwise contact the perimeter surface 116 of the evaporator 110. Condenser surface 122 is defined by a porous layer that extends from the condenser perimeter surface 124. The condenser surface 122 may also be formed by sintering metal particles (e.g., copper particles) as described above. The condenser surface 122 has a width, height, and depth to fit within the perimeter surface 116 of the evaporator assembly 110.

To form the vapor chamber, the condenser surface 122 is positioned on the top of the array of posts 112 and the porous perimeter ledge 115, if provided. After placement of the condenser plate 120 on the evaporator assembly 110, the two components are then bonded together, such as by diffusion bonding. The bonding of these two components define a vapor chamber that may then be filled with the cooling fluid.

Figure 3:
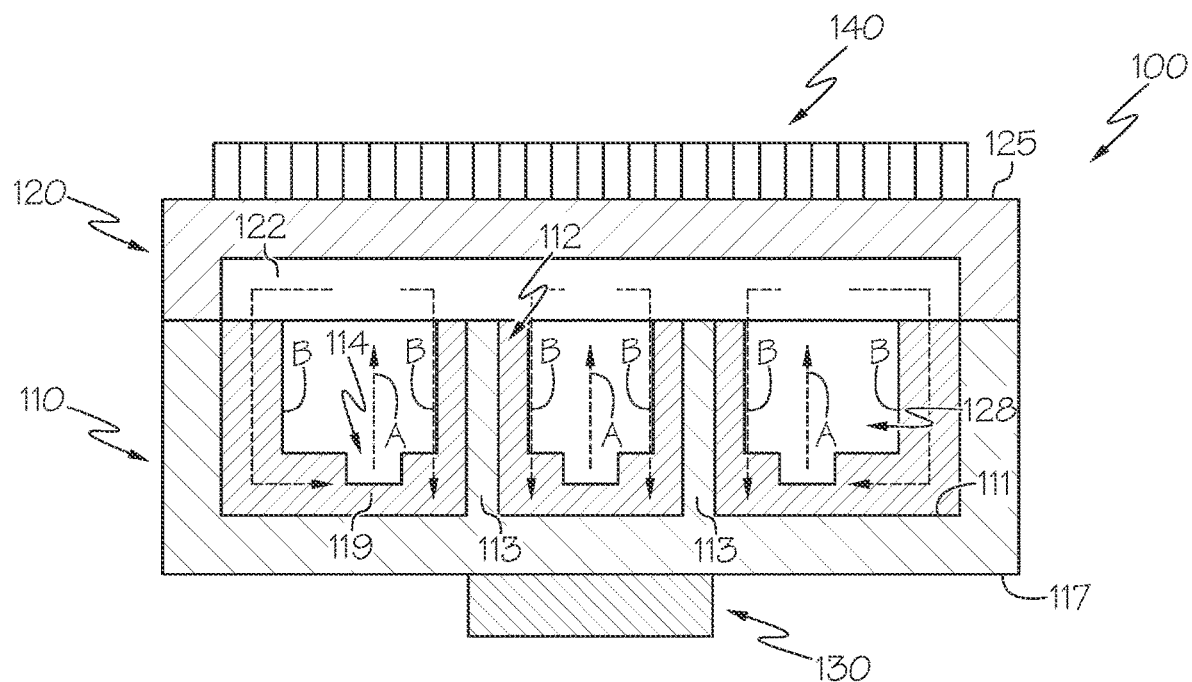
FIG. 3 schematically depict a cross-sectional view of a vapor chamber according to one or more embodiments described and illustrated herein.

Referring now to FIG. 3, a cross-sectional view of an example assembly 100 including a cooling device 101 comprising a vapor chamber 128, a heat generating device 130, and a heat sink 140. It is noted that FIG. 3 is a simplified view for illustrative purposes only. Particularly, a row including only two posts 112 and three vapor vents 114 is shown. It should be understood that the rows of the cooling devices 101 disclosed herein may include many additions posts 112 and vapor vents. 114.

As shown by FIG. 3, the posts 112 comprise a pin fin 113 surrounded by the porous layer 119. As stated above, the pin fins 113 may be formed by machining the evaporator surface 111 or by chemical etching. Having posts 112 with a solid pin fin 113 core may reduce the thermal resistance between the condenser plate 120 and the evaporator assembly 110 over having the posts fabricated from only the porous layer, further improving the performance of the vapor chamber.

After the vapor chamber 128 is sealed by bonding the condenser plate 120 to the evaporator assembly 110, cooling fluid is introduced to the vapor chamber 128 by the inlet port 118 (FIG. 1A). During operation, the heat generating device 130, which may be a power electronic device, for example, generates heat flux. Liquid cooling fluid present on the evaporator surface 111 and within the porous layer 119 receives the heat flux and rises in temperature to above its boiling point. The liquid cooling fluid begins to boil and change phase from liquid to vapor. The pores within the porous layer 119 provide nucleation sites for efficient boiling. The vapor cooling fluid rises up toward the condenser surface 122, as shown by arrows A.

The heat sink 140 is attached to the cooling surface 125 of the condenser plate 120. The heat sink 140 may be any cooling device, such as a finned heat sink, a thermal spreader, a liquid cooling device, and the like. The heat sink 140 removes heat flux from the condenser plate 120 to cool the vapor cooling fluid such that it condenses back into a liquid. The porous condenser surface 122 and the porous posts 112 wick the condensed liquid cooling fluid back toward the evaporator surface 111 as indicated by arrows B, where it is once again heated and turned into a vapor.

The vapor vents 114 reduces the resistance for the vapor to escape the evaporator surface 111. The vapor vents 114 provide an easier location for nucleation bubbles to escape the porous layer 119 at the evaporator surface 111. Thus, the vapor vents 114 allow the vapor to vent toward the condenser surface 122.

The size, shape, and/or density of the posts 112 and/or the vapor vents 114 may be varied across the evaporator surface 111 to address local hotspots. For example, the size, shape, and/or density of the posts 112 and/or vapor vents 114 directly above the heat generating device 130 may be different than the size, shape, and/or density of the posts 112 and/or vapor vents 114 away from the heat generating device 130. The size, shape and/or density of the posts 112 and/or vapor vents 114 may vary across the evaporator surface 111 in any manner.

Figure 4:
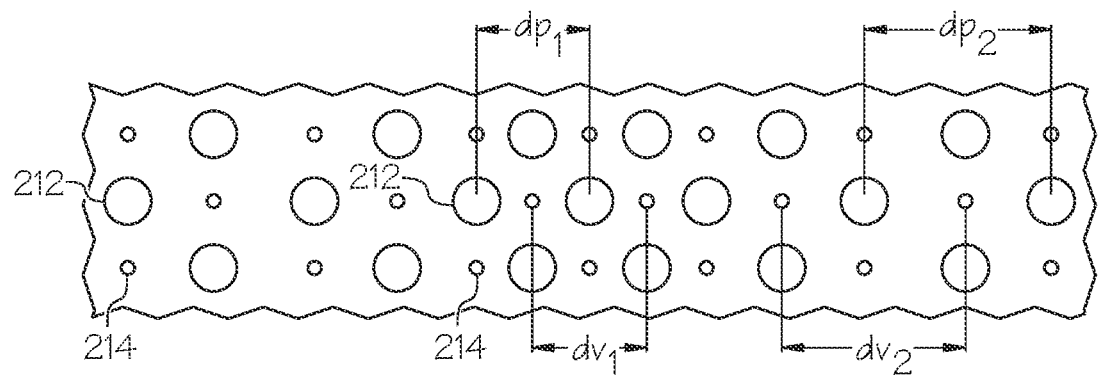
FIG. 4 schematically depicts an example evaporator surface having an array of posts and an array of vapor vents wherein a distance between adjacent posts and a distance between adjacent vapor vents vary across the evaporator surface according to one or more embodiments described and illustrated herein.

FIG. 4 illustrates a partial view of an example evaporator surface 211 wherein centrally located adjacent posts 212 have a spacing $dp_1$ and centrally located adjacent vents 214 have a spacing $dv_1$. However, adjacent posts 212 further toward the perimeter of the evaporator surface 211 have a spacing $dp_2$ and adjacent vapor vents 214 further toward the perimeter of the evaporator surface 211 have a spacing $dv_2$. In the illustrated example, $dp_1$ is greater than $dp_2$ and $dv_1$ is greater than $dv_2$. As an example, the density of the posts 212 and the vapor vents 214 may be directly above the heat generating device than areas outside of the heat generating device.

Figure 5:
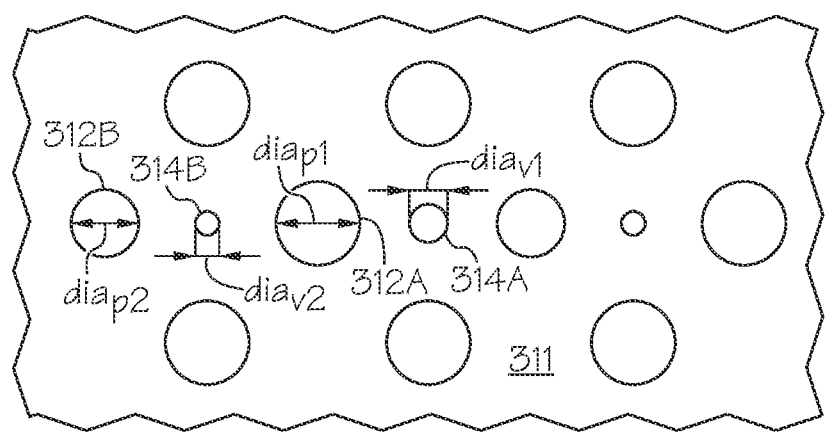
FIG. 5 schematically depicts an example evaporator surface having an array of posts and an array of vapor vents wherein a size of individual posts and a size of individual vapor vents vary across the evaporator surface according to one or more embodiments described and illustrated herein.

FIG. 5 illustrates a partial view of an example evaporator surface 311 wherein a size of the posts 312 and vapor vents 314 vary. Centrally adjacent located posts 312 have a diameter $dia_{p1}$ and centrally located adjacent vapor vents 314 have a diameter $dia_{v1}$. However, adjacent posts 312 further toward the perimeter of the evaporator surface 311 have a diameter $dia_{p2}$ and adjacent vapor vents 314 further toward the perimeter of the evaporator surface have a diameter $dia_{v2}$. In the illustrated example, $dia_{p1}$ is greater than $dia_{p2}$ and $dia_{v1}$ is greater than $dia_{v2}$. It should be understood that in other embodiments, $dia_{p1}$ is less than $dia_{p2}$ and $dia_{v1}$ is less than $dia_{v2}$.

To assess the performance of the vapor chamber, two set of experiments were conducted. One experiment measure total thermal resistance of the vapor chamber in an air-cooling test, and the second experiment extracted the through-plane thermal resistance of the vapor chamber itself. A vapor chamber having machined posts with a porous layer that had a diameter of about 1.5 mm and a height of 2.4 mm and vapor vents having a diameter of 1 mm and 0.5 mm deep as shown in FIG. 1A was fabricated. Three comparative example vapor chambers were also fabricated. A first comparative vapor chamber included a monolayer evaporator surface with no posts or vents. A second comparative vapor chamber included posts made out of only porous material (no solid pin fins) that were 1.5 mm in diameter and 2.4 mm in height and no vents. A third comparative vapor chamber included posts made of a pin fin that was 0.5 mm in diameter and 2.4 mm in height surrounded a porous layer to define posts having a diameter of 1 mm and a height of 2.4 mm. The third comparative vapor chamber did not include vents.

Figure 6:
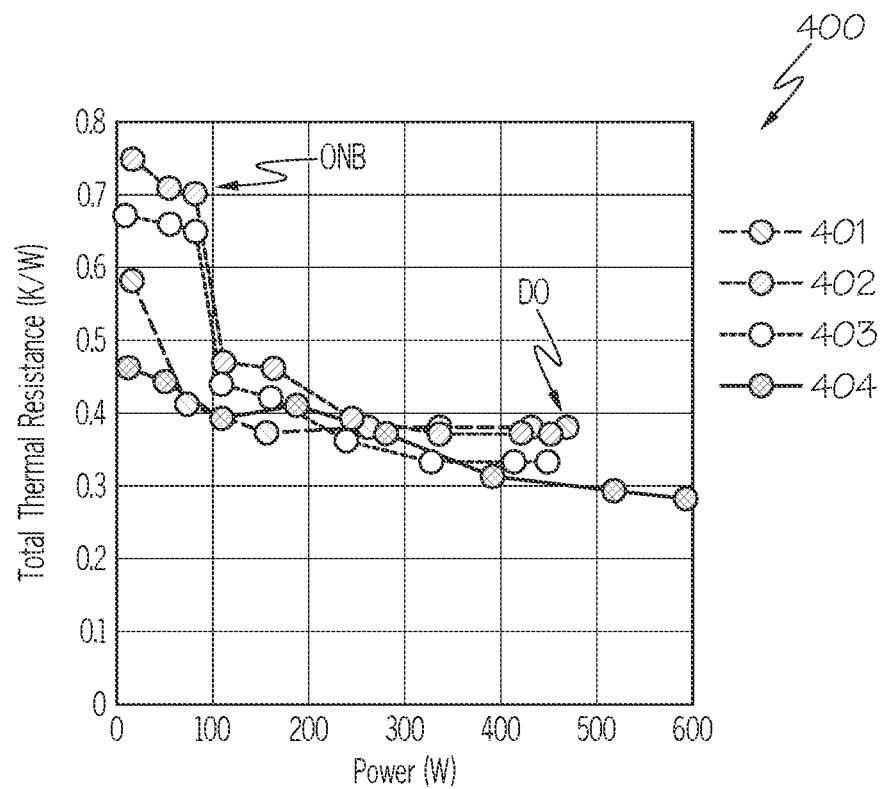
FIG. 6 graphically depicts plots of total thermal resistance as a variation of power for four different vapor chamber designs according to one or more embodiments described and illustrated herein.
Figure 7:
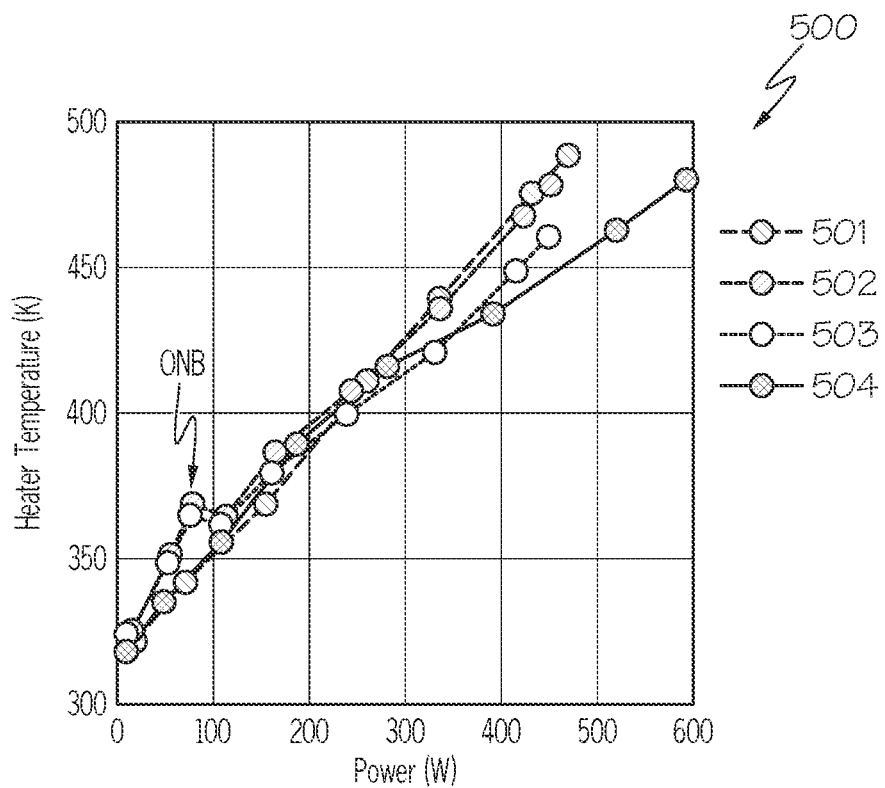
FIG. 7 graphically depicts plots of heater temperature as a variation of power for the four different vapor chamber designs of FIG. 6 according to one or more embodiments described and illustrated herein.

The variation in the thermal resistance and heater temperature with input power is shown in FIGS. 6 and 7, respectively. Trace 401 is the first comparative example, trace 402 is the second comparative example, trace 403 is the third comparative example, and trace 404 is the vapor chamber with posts and vents. As seen from FIG. 6, the trend in the thermal resistance of each vapor chamber is quite similar, i.e., the thermal resistance is higher at lower powers (<100 W), drops once the onset of nucleate boiling (ONB) is reached, and is near constant in the nucleate boiling region. Below an input power of 100 W, the first comparative example (i.e., the monolayer vapor chamber) has lower thermal resistance than the second comparative example (i.e., the sintered post vapor chamber) and the third comparative example (i.e., the machined post vapor chamber). However, in the boiling region for input power>300 W, the thermal resistance of the first comparative example is higher compared to the post-based designs.

The thermal resistance of the machined post vapor chamber (trace 403) is slightly lower than the sintered post design (trace 402) over the entire power range. For example, the thermal resistance of the machined post vapor chamber (trace 403) at an input power of 110 W is about 6% lower than the sintered post vapor chamber (trace 402), while it is 11% lower at a high input power of 450 W.

Among all the vapor chamber designs, the machined post plus vents vapor chamber (trace 404) in accordance with the present disclosure has the lowest thermal resistance for the entire range of input power. Unlike the behavior of the other vapor chambers, the thermal resistance of the machined post plus vents vapor chamber (trace 404) does not plateau in the boiling region but instead keeps decreasing until the maximum capacity of the power supply is reached.

Furthermore, the monolayer vapor chamber (trace 401) reaches dry out (DO) at an input power of 467 W, which was observed as a linear rise in the transient heater temperature without reaching steady state. Note that the rest of the vapor chamber designs did not exhibit this dry out phenomena. The maximum power dissipated by the sintered post (trace 402) and machined post designs (trace 403) were 450 W and 447 W respectively. The tests were stopped since the heater temperature exceeded the maximum allowable temperature of 478° C. For the machined post plus vent vapor chamber (trace 404), the input power supply reached its maximum capacity and therefore the testing was discontinued.

The variation of the heater temperature with input power is shown in FIG. 7. The sintered post (trace 502) and machined post (trace 503) vapor chambers show a linear rise in temperature with power until the ONB power of about 100 W is reached. Unlike the sintered post and machined post vapor chambers, the ONB point for the monolayer (trace 501) and machined post plus vents (trace 504) vapor chamber is not distinctly observed from FIG. 7. Furthermore, the rate of increase in the heater temperature of the machined post plus vents vapor chamber begins to decrease between 300 W and 400 W (as seen in trace 504), followed by a linear rise in the heater temperature thereafter. The machined post plus vents vapor chamber can dissipate significantly higher power compared to others for the same heater temperature. For example, at a heater temperature of 473° C., the machined post plus vents vapor chamber dissipates 30% more power compared to the monolayer vapor chamber (trace 501).

Figure 8:
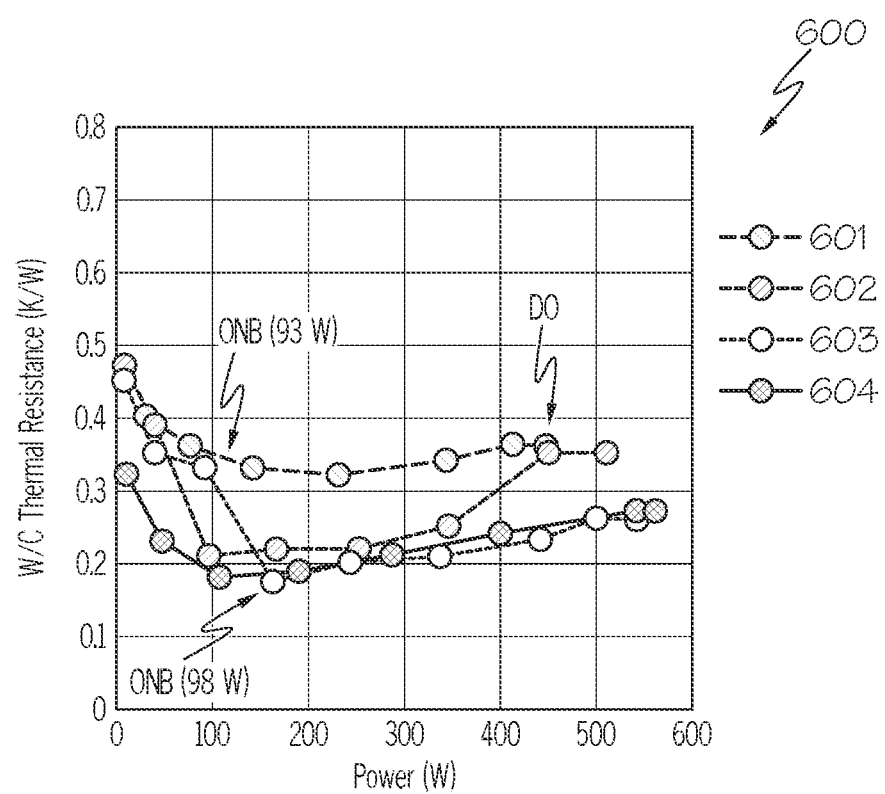
FIG. 8 graphically depicts plots of through plane thermal resistance as a variation of power for the four different vapor chamber designs of FIG. 6 according to one or more embodiments described and illustrated herein.

The variation of the through plane thermal resistances of the vapor chambers as a function of input power, is shown in FIG. 8. The monolayer vapor chamber (trace 601) generally has the highest thermal resistance compared to the post-based designs. The thermal resistance of the sintered (trace 602) and machined post (trace 603) vapor chamber are slightly higher than the monolayer thermal resistance in the low power region<50 W. At an input power of about 98 W and 93 W, the ONB is observed for the sintered (trace 602) and machined post (trace 603) vapor chambers, respectively. At the ONB power, the through plane thermal resistance of both the vapor chambers drops dramatically by approximately half of its value.

The machined post plus vents vapor chamber (trace 604) has the lowest through plane thermal resistance for the entire range of power. For example, the through plane thermal resistance of the machined post plus vents vapor chamber at an input power of 110 W and 559 W is 0.18 K/W and 0.27 K/W, respectively. At powers higher than the ONB power, the thermal resistance of all vapor chambers rises linearly with input power. Among all vapor chambers tested, only the monolayer vapor chamber (trace 601) reached dry out (DO) at an input power of 457 W. The maximum power dissipated by the remaining vapor chamber designs were limited by the maximum current capacity of power supply (~10 A), and testing was terminated in these cases. The maximum power dissipated by the machined post plus vents vapor chamber (trace 604) was 589 W.

Figure 9:
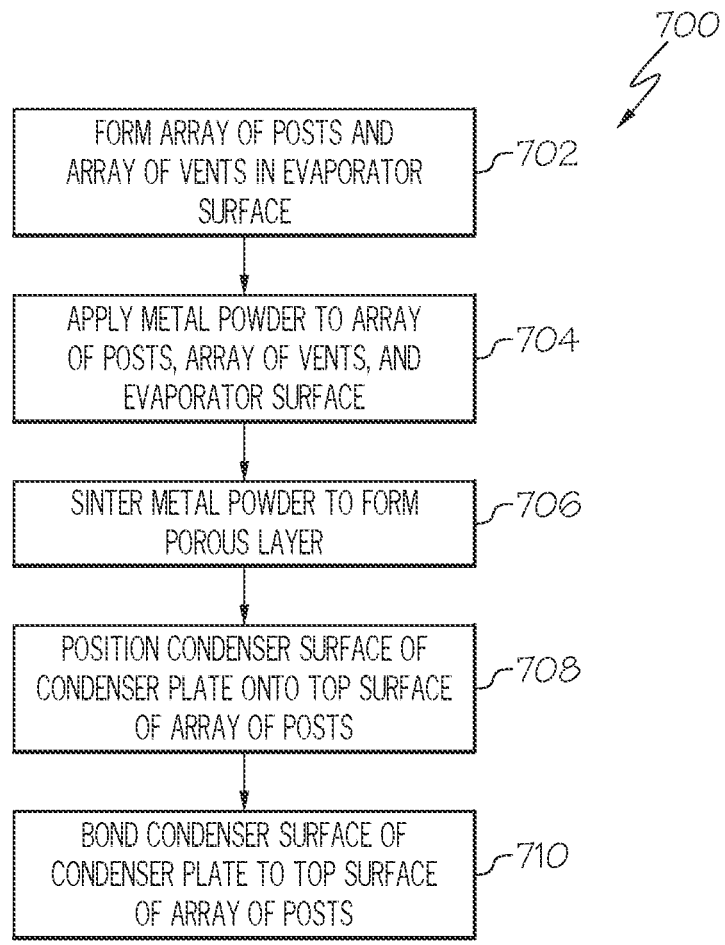
FIG. 9 graphically depicts a flowchart of an example method for fabricating a vapor chamber according to one or more embodiments described and illustrated herein.

Referring now to FIG. 9, an example method of fabricating a vapor chamber is illustrated by flowchart 700. At block 702, an array of posts and an array of vents are formed in an evaporator surface of an evaporator plate. The array of posts and the array of vents may be fabricated by machining, for example. As another example, the array of posts and the array of vents may be fabricated by chemical etching. For example, where the evaporator surface is made from copper, a mask may be applied to the evaporator surface and a chemical etchant, such as ferric chloride may be applied to form the desired array of posts and the array of vents.

At block 704, a metal powder comprising metal particles is applied to the evaporator surface, the array of posts, and the array of vents. The metal particles may include copper particles for example. At block 706, the metal powder is sintered to form a porous layer around the evaporator surface, the array of posts, and the array of vents. The porous layer provides both enhanced nucleation sites as well as a wicking structure to return liquid cooling fluid to the evaporator surface and the array of vents.

At block 708, a porous condenser surface of a condenser plate is positioned on a top surface of the array of posts. This defines a vapor chamber between the condenser surface and the evaporator surface. Finally, at block 710, the condenser surface is bonded to the top surface of the array of posts. As a non-limiting example, the condenser surface is bonded to the top surface of the array of posts is performed by diffusion bonding.

It should now be understood that embodiments of the present disclosure are directed to vapor chambers having an evaporator surface with an array of posts and an array of vapor vents. Each post includes a solid core that is surrounded by a porous layer. The solid core, which may be provided by a pin fin, lowers thermal resistance between the condenser surface and the evaporator surface. The array of vents provide an easier escape path for vapor as well as additional nucleation sites for vapor. The vapor chambers described herein have a low thermal resistance and a high dry out temperature. The vapor chambers herein may be utilized to cool power electronic device, such as wide band gap power electronic devices that produce significant heat flux, used in inverter circuits of electric or hybrid electric vehicles.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:

1. An evaporator assembly for a vapor chamber, the evaporator assembly comprising:
   an evaporator surface opposite a heat receiving surface;
   an array of posts extending from the evaporator surface;
   an array of vapor vents within the evaporator surface, wherein each vapor vent of the array of vapor vents is configured as a depression within the evaporator surface; and
   a porous layer disposed on the evaporator surface, the array of posts, and the array of vapor vents.

2. The evaporator assembly of claim 1, wherein the array of posts is interlaced within the array of vapor vents.

3. The evaporator assembly of claim 1, wherein
   a spacing between adjacent posts of the array of posts vary on the evaporator surface; and
   a spacing between adjacent vapor vents of the array of vapor vents vary on the evaporator surface.

4. The evaporator assembly of claim 1, wherein at least one of a size and a shape of individual vapor vents of the array of vapor vents varies across the evaporator surface.

5. The evaporator assembly of claim 1, wherein a thickness of the porous layer is between 0.20 mm and 1 mm, including endpoints.

6. The evaporator assembly of claim 1, wherein a depth of individual vapor vents varies across the evaporator surface.

7. The evaporator assembly of claim 1, wherein the array of posts and the array of vapor vents define a structure array, wherein each row of the structure array comprises alternating individual posts and individual vents.

8. An assembly comprising:
   an evaporator assembly comprising:
      an evaporator surface opposite a heat receiving surface;
      an array of posts extending from the evaporator surface;
      an array of vapor vents within the evaporator surface, wherein each vapor vent of the array of vapor vents is configured as a depression within the evaporator surface; and
      a porous layer disposed on the evaporator surface, the array of posts, and the array of vapor vents; and
   a condenser plate comprising a condenser surface, wherein the condenser surface is bonded to a top surface of the array of posts such that the evaporator assembly and the condenser plate define a vapor chamber.

9. The assembly of claim 8, wherein
   the assembly further comprises an electronic device coupled to the heat receiving surface.

10. The assembly of claim 9, wherein:
    the condenser surface is provided on a condenser plate further comprising a cooling surface; and
    the assembly further comprises a heat sink coupled to the cooling surface.

11. The assembly of claim 8, wherein the array of posts is interlaced within the array of vapor vents.

12. The assembly of claim 8, wherein
    a spacing between adjacent posts of the array of posts vary on the evaporator surface; and
    a spacing between adjacent vapor vents of the array of vapor vents vary on the evaporator surface.

13. The assembly of claim 8, wherein at least one of a size and a shape of individual vapor vents of the array of vapor vents varies across the evaporator surface.

14. The assembly of claim 8, wherein a thickness of the porous layer is between 0.20 mm and 1 mm, including endpoints.

15. The assembly of claim 8, wherein a depth of individual vapor vents varies across the evaporator surface.

16. The assembly of claim 8, wherein the array of posts and the array of vapor vents define a structure array, wherein each row of the structure array comprises alternating individual posts and individual vents.

17. The evaporator assembly of claim 1, wherein:
    the array of posts extend from the evaporator surface in a positive z-axis direction; and
    the array of vapor vents extend within the evaporator surface in a negative z-axis direction.

18. The assembly of claim 1, wherein:
    the array of posts extend from the evaporator surface in a positive z-axis direction; and
    the array of vapor vents extend within the evaporator surface in a negative z-axis direction.

* * * * *